US011589482B2

(12) United States Patent
Gao (10) Patent No.: US 11,589,482 B2
(45) Date of Patent: Feb. 21, 2023

(54) COOLING MODULE WITH SERIAL FLUID MANAGEMENT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 72 days.

(21) Appl. No.: 17/349,513

(22) Filed: Jun. 16, 2021

(65) Prior Publication Data

US 2022/0408606 A1 Dec. 22, 2022

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |

(52) U.S. Cl.
CPC ..... *H05K 7/20763* (2013.01); *H05K 7/20836* (2013.01)

(58) Field of Classification Search
CPC ........... H05K 7/20763; H05K 7/20836; H05K 7/20745; H05K 7/20727; H05K 7/20709
See application file for complete search history.

(56) References Cited

U.S. PATENT DOCUMENTS

| | | | | |
|---|---|---|---|---|
| 8,964,391 B2 * | 2/2015 | Campbell | ............... | F28F 3/048 |
| | | | | 361/679.53 |
| 9,016,352 B2 * | 4/2015 | Helbig | ................... | F28F 9/007 |
| | | | | 361/695 |
| 10,178,801 B2 * | 1/2019 | Liu | ....................... | H05K 7/1488 |
| 10,201,116 B1 * | 2/2019 | Ross | ................... | H05K 7/20836 |
| 10,701,838 B1 * | 6/2020 | Conroy | .............. | H05K 7/20781 |
| 11,044,833 B2 * | 6/2021 | Huang | ............... | H05K 7/20781 |
| 11,252,844 B2 * | 2/2022 | Shao | ..................... | H05K 7/1489 |
| 2013/0025818 A1 * | 1/2013 | Lyon | .................. | H05K 7/20781 |
| | | | | 165/181 |
| 2013/0128459 A1 * | 5/2013 | Pautsch | .............. | H05K 7/20781 |
| | | | | 361/695 |
| 2014/0124174 A1 * | 5/2014 | Campbell | .......... | H05K 7/20809 |
| | | | | 29/890.035 |
| 2014/0146465 A1 * | 5/2014 | Wei | ..................... | H05K 7/20736 |
| | | | | 454/184 |
| 2022/0117119 A1 * | 4/2022 | Heydari | ............. | H05K 7/20745 |
| 2022/0210955 A1 * | 6/2022 | Heydari | ............... | H05K 7/2079 |

* cited by examiner

*Primary Examiner* — Anthony M Haughton
(74) *Attorney, Agent, or Firm* — Womble Bond Dickinson (US) LLP (57) ABSTRACT

Embodiments are disclosed of a cooling apparatus with one or more cold plates, each adapted to be thermally coupled to a heat-generating electronic component on a piece of IT equipment. A fluid control module is mounted to the substrate and fluidly coupled to the cold plates. The fluid control module includes a fluid inlet with an inlet mechanism adapted to enable and disable the fluid inlet; the inlet mechanism enables the fluid inlet when energized and disables the fluid inlet when de-energized. The fluid control module also includes a fluid outlet with an outlet mechanism adapted to enable and disable the fluid outlet; the outlet mechanism enables the fluid outlet when energized and disables the fluid outlet when de-energized. A dedicated power supply is electrically coupled to the inlet mechanism and the outlet mechanism, and when the inlet mechanism is de-energized, the outlet mechanism is also de-energized after a delay.

20 Claims, 8 Drawing Sheets

Mechanism Deactivated/Inlet Disengaged

*Fig. 3A*

Mechanism Activated/Inlet Engaged

Fig. 8

COOLING MODULE WITH SERIAL FLUID MANAGEMENT

TECHNICAL FIELD

The disclosed embodiments relate generally to servers and in particular, but not exclusively, to a cooling module used with servers in an information technology (IT) rack of the kind found in data centers.

BACKGROUND

Modern data centers like cloud computing centers house enormous amounts of information technology (IT) equipment such as servers, blade servers, routers, edge servers, power supply units (PSUs), battery backup units (BBUs), etc. These individual pieces of IT equipment are typically housed in racks within the computing center, with multiple pieces of IT equipment in each rack. The racks are typically grouped into clusters within the data center.

As IT equipment has become more computationally powerful it also consumes more electricity and, as a result, generates more heat. This heat must be removed from the IT equipment to keep it operating properly. To keep up with this increasing need for heat removal, IT equipment has incorporated internal liquid cooling systems and, at the same time, the IT racks in which IT equipment is housed have incorporated rack-level liquid cooling systems that interface with the internal liquid cooling systems of the IT equipment.

One problem with current server liquid cooling and rack-level liquid cooling systems is that they can leak, potentially causing damage to themselves, to the IT equipment to which they are coupled, and to other IT equipment housed in the same rack. Designing a rack-level liquid cooling system that eliminates the single failure point is challenging; simple changes, such as adding fluid distribution components to the rack, might not function properly because such racklevel changes often require corresponding changes in the IT equipment—changes that can only be made effectively by designing the rack and IT equipment together. And existing solutions may not provide mature solution for responding the incidents of fluid leakage.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of a cooling module for use with a piece of information technology (IT) equipment such as a server in an IT rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

The liquid cooling module embodiments described below can significantly decrease the impact of fluid leakage incidents and can be easily applied to server systems and other IT equipment. In addition, the described embodiments include components and hardware assembly to achieve different types of operations according to actual use cases or server designs. The described embodiments are applicable on critical server and edge servers which are thermally managed by liquid cooling solutions. One aim is to increase the overall system reliability of fluid running through the cooling module. The main challenges include:

System and module design for liquid cooling to increase reliability.
Hardware solution for eliminating fluid leakage impact.
Support hyperscale deployment.
Critical requirement from cloud and edge servers.
Accommodate different server architectures.
Accommodate different rack level design.
Common interface design, including power interface and fluid control interface.
Interoperability to decrease customization needed to meet different requirements.

The disclosed embodiments include advanced connectors for high reliability. The module is designed to respond to leakage incidents. The design enables fast shutoff of cooling fluid flowing into the cooling module and pumping fluid remaining in the module out of the module to the main system. The cooling fluid contained in the leaking module decreases significantly and the leak's impact is significantly reduced or eliminated. In different embodiments, the combination of the power module, energy storage device, and switch are arranged in different ways to achieve asynchronous operations of the fluid controls and fluid connectors. The interfaces, including the power, control, and fluid interfaces, are designed to accommodate different server and rack use cases.

Figure 1:
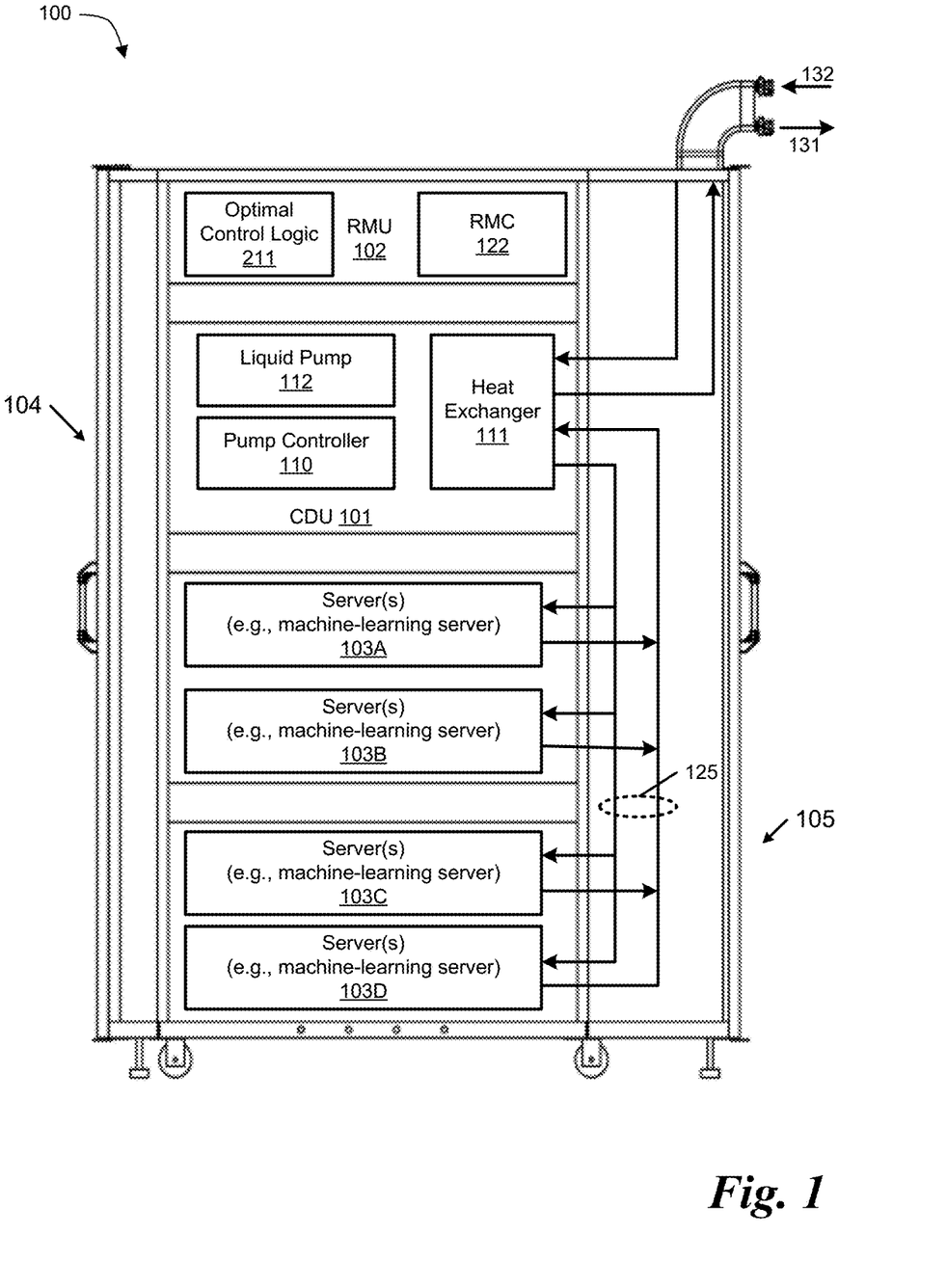
FIG. 1 is a side view of an embodiment of a liquid-cooled information technology (IT) rack populated with various pieces of IT equipment.

FIG. 1 is a block diagram illustrating a side view of an embodiment of an information technology (IT) rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a liquid cooling module, such as the ones shown in FIG. 2 et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2:
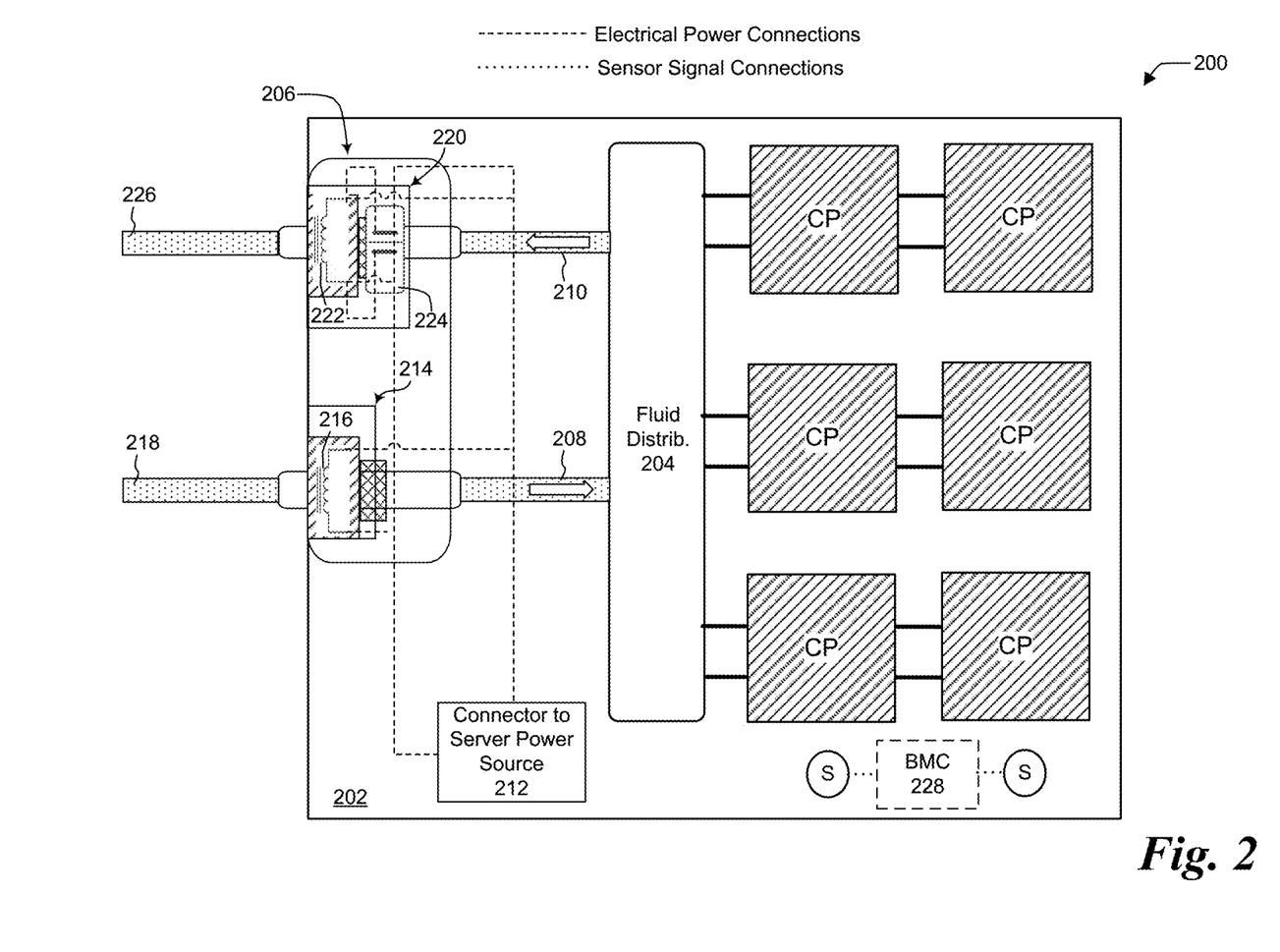
FIG. 2 is a plan view of an embodiment of cooling module for use with IT equipment.

FIG. 2 illustrates an embodiment of a cooling module 200 that can be coupled with a piece of information technology (IT) equipment, such as a server, to cool heat-generating components on the server, such as processors, memory, graphics processing units, etc.

Cooling module 200 includes a substrate 202 on which are mounted one or more cold plates CP. The illustrated embodiment has six cold plates CP, but other embodiments can include more or less cold plates than shown. Cold plates CP are positioned in substrate 202 so that when module 200 is coupled to a piece of IT equipment the cold plates will align with heat-generating components on the IT equipment. The cold plates can then be thermally coupled to the heat-generating components to remove the heat they generate. Each cold plates CP has internal fluid channels through which a cooling fluid can circulate and absorb heat, and each cold plate is fluidly coupled by a fluid supply line and a fluid return line to fluid distribution module 204, which can include various elements such as inlet and outlet manifolds, pumps, etc. Fluid distribution module 204 is in turn fluidly coupled to a fluid control module 206 by a main inlet connection 208 and a main outlet connection 210. Substrate 202 also includes a power connector 212 that connects to a power source on the piece of IT equipment that cooling module 200 will be used to cool. In this embodiment, then, cooling module 200 does not have its own electrical power source, but instead gets it electrical power from the piece of IT equipment it is used with.

One or more leak-detection sensors S are also positioned on substrate 202 to detect fluid leaks in the cooling module. The illustrated embodiment includes two leak-detection sensors S, but other embodiments can include more or less leak-detection sensors than shown. In the illustrated embodiment leak-detection sensors S are positioned near an edge of substrate 202, but in other embodiments leak-detection sensors S can be positioned differently than shown; for instance, in one embodiment every major fluid-handling element, such as cold plates CP, can have an adjacent sensor S. In the illustrated embodiment, leak-detection sensors S can be communicatively coupled to the baseboard management controller (BMC) 228 of the piece of IT equipment to which module 200 is coupled. Upon receiving signals from leak-detection sensors S that are leak is been detected, the BMC can shut down the power to its IT equipment.

Fluid control module 206 controls and manages the fluid recirculation within module 200. Fluid control module 206 includes an inlet control 214 and an outlet control 220. Inlet control 214 fluidly couples a fluid supply line 218 to main inlet connection 208, while outlet control 220 fluidly couples main outlet connection 210 to a fluid return line 226.

Inlet control 214 includes an inlet electromagnetic mechanism 216 that can enable and disable fluid flow from fluid supply line 218 into module 200—i.e., flow between fluid supply line 218 and main inlet line 208. In one embodiment, electromagnetic mechanism 216 enables fluid flow by engaging fluid supply line 218—that is, by physically connecting fluid supply line 218 to the inlet control—and disables fluid flow by disengaging fluid supply line 218 from inlet control 214—i.e., by physically disconnecting fluid supply 218 (see, e.g., FIGS. 3A-3B).

Electromagnetic mechanism 216 is electrically coupled to connector 212, so that it receives its electrical power from the connector. In one embodiment, electromagnetic mechanism 216 can be configured so that when energized—i.e., when electrical power is supplied to the electromagnetic mechanism—the electromagnetic mechanism 216 engages supply line 218, and when de-energized it disengages supply line 218. Operation of an embodiment of electromagnetic mechanism 216 is further explained below in connection with FIGS. 3A-3B.

Outlet control 220 similarly includes an outlet electromagnetic mechanism 222 that can enable and disable fluid flow out of module 200—i.e., flow between main return line 210 and fluid return line 226. In one embodiment, electromagnetic mechanism 222 enables fluid flow by engaging fluid return line 226 (i.e., by physically connecting fluid return line 226 to the outlet control 220) and disables fluid flow by disengaging fluid return line 226 from outlet control 220 (i.e., by physically disconnecting fluid return line 226). Outlet control 220 further includes a separate power source 224 that is electrically coupled to electromagnetic mechanism 222, so that upon the failure or interruption of power from connector 212 electromagnetic mechanism 222 has a supply of electrical power for limited time after the failure or interruption. Using power source 224, outlet control 220 can remain engaged for limited time after a power failure or interruption, allowing fluid cooling fluid to exit module 200 into return line 226. In one embodiment, power source 224 can be an energy storage device such as a battery, but in other embodiments it can be some other type of power source.

Figure 3A:
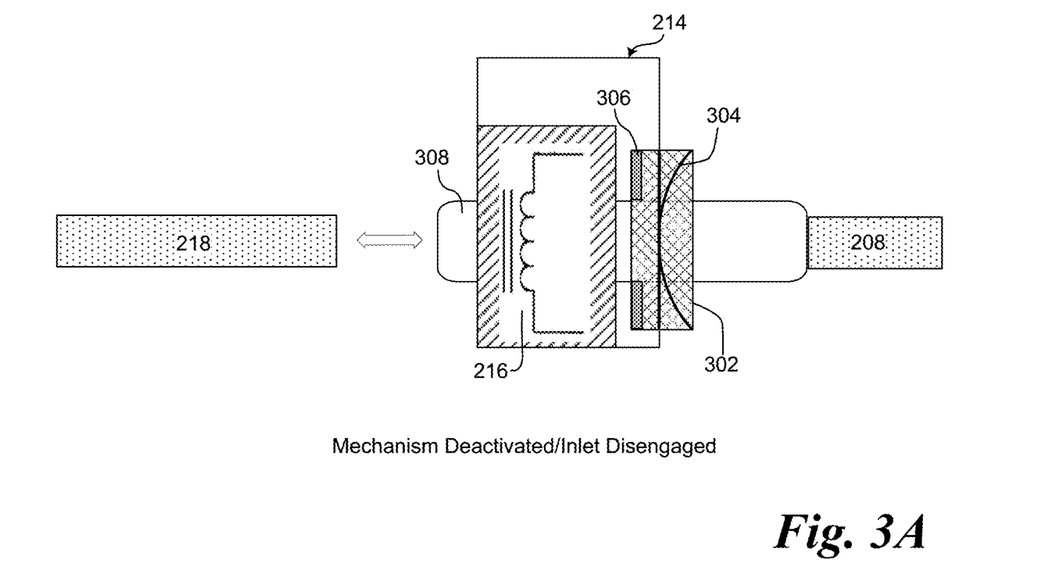
FIGS. 3A-3B are plan views of an embodiment of a fluid connector that can be electromagnetically engaged and disengaged.
Figure 3B:
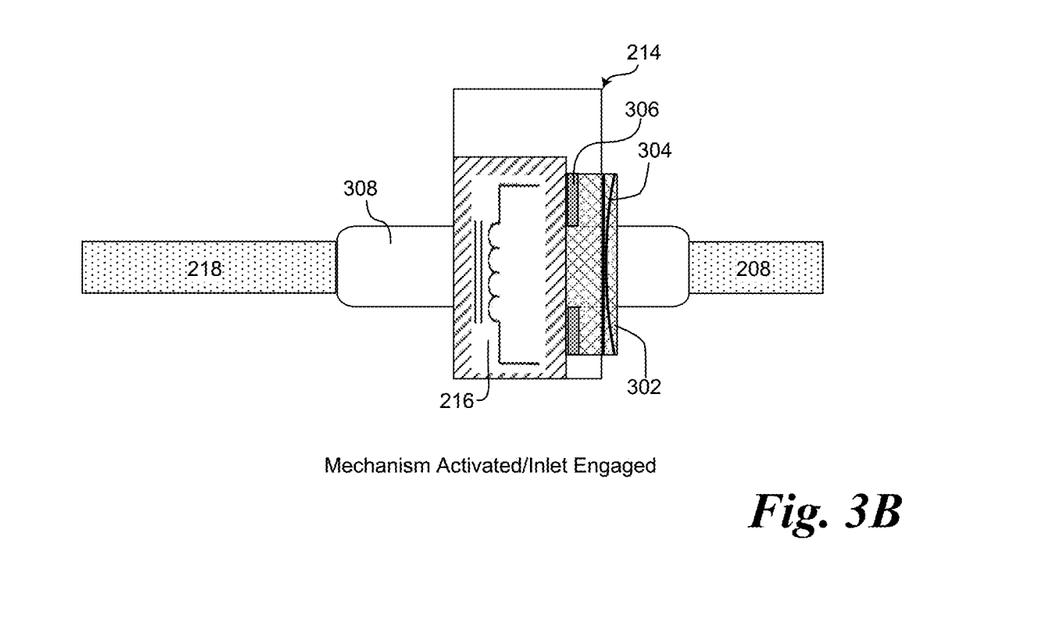

FIGS. 3A-3B together illustrate an embodiment of the operation of inlet control 214 of cooling module 200. FIG. 3A shows the inlet control in its disengaged position (i.e., closed, so that no fluid can enter module 200), and FIG. 3B shows the inlet control in its engaged position (i.e., open, so that fluid can enter module 200). In module 200, outlet control 220 is configured similarly and works similarly, except that, as explained above, outlet control 220 includes separate power source 224 that creates a delay between disengagement of the inlet control and disengagement of the outlet control. But in other embodiments of module 200 inlet control 214 and outlet control 220 need not be configured similarly, nor do they need to operate similarly.

As shown in FIG. 3A, supply line 218 includes a coupler 302 fixed to a fluid connector 308 and also fixed to main inlet connection 208. Coupler 302 can, for instance, be similar to the couplers used in quick-disconnect fittings. Coupler 302 includes a magnetic or non-magnetic material 306 that will be subjected to a force when put in a magnetic field. In one embodiment, for instance, material 306 can be iron or steel, but in other embodiments it can be a magnet. Coupler 302 can also include an elastic member 304; in one embodiment, elastic member 304 can be an annular leaf spring, but in other embodiments it can be a different type of elastic member. Elastic member 304 biases connector 308 to a position where it is disengaged from supply line 218, shown in FIG. 3A. Coupler 302 can also include features that reduce or eliminate fluid leaks during connection and disconnection.

In operation, connector 308 is initially positioned such that it is disengaged from supply line 218, as shown in FIG. 3A. Electromagnetic mechanism 216 is then energized (i.e., electrical power is supplied to it), at which point the electromagnetic mechanism begins generating a magnetic field. The magnetic field attracts material 306 strongly enough to overcome the bias of elastic member 304, pulling coupler 302 toward the electromagnetic mechanism, thus also sliding connector 208 toward supply line 218 until the connector firmly engages with supply line 218 to the main inlet connection 208; this engagement is shown in FIG. 3B. Although not shown in the figure, in one embodiment the fluid connection between connector 308 and supply line 218 can be a dripless blind-mating connection, but in other embodiments the connection between connector 308 and supply line 218 can be something different. Once connector 308 engages with supply line 218, a flow path is created that allows fluid to flow from supply line 218 through connector 308 and into main inlet connection 208. When electromagnetic mechanism 216 is deenergized, it stops producing a magnetic field. Without the magnetic field there is no longer a magnetic force attracting material 306, so there is no force to overcome the bias of elastic member 304. As a result, elastic member 304 exerts a force on coupler 302 that pulls it and connector 308 away from supply line 218, thus disengaging supply line 218 from main inlet connection 208 and returning to the disengaged position shown in FIG. 3A. In this position, there is no flow path between supply line 218 and main inlet connector 208, so that fluid flow into module 200 is terminated.

Figure 4:
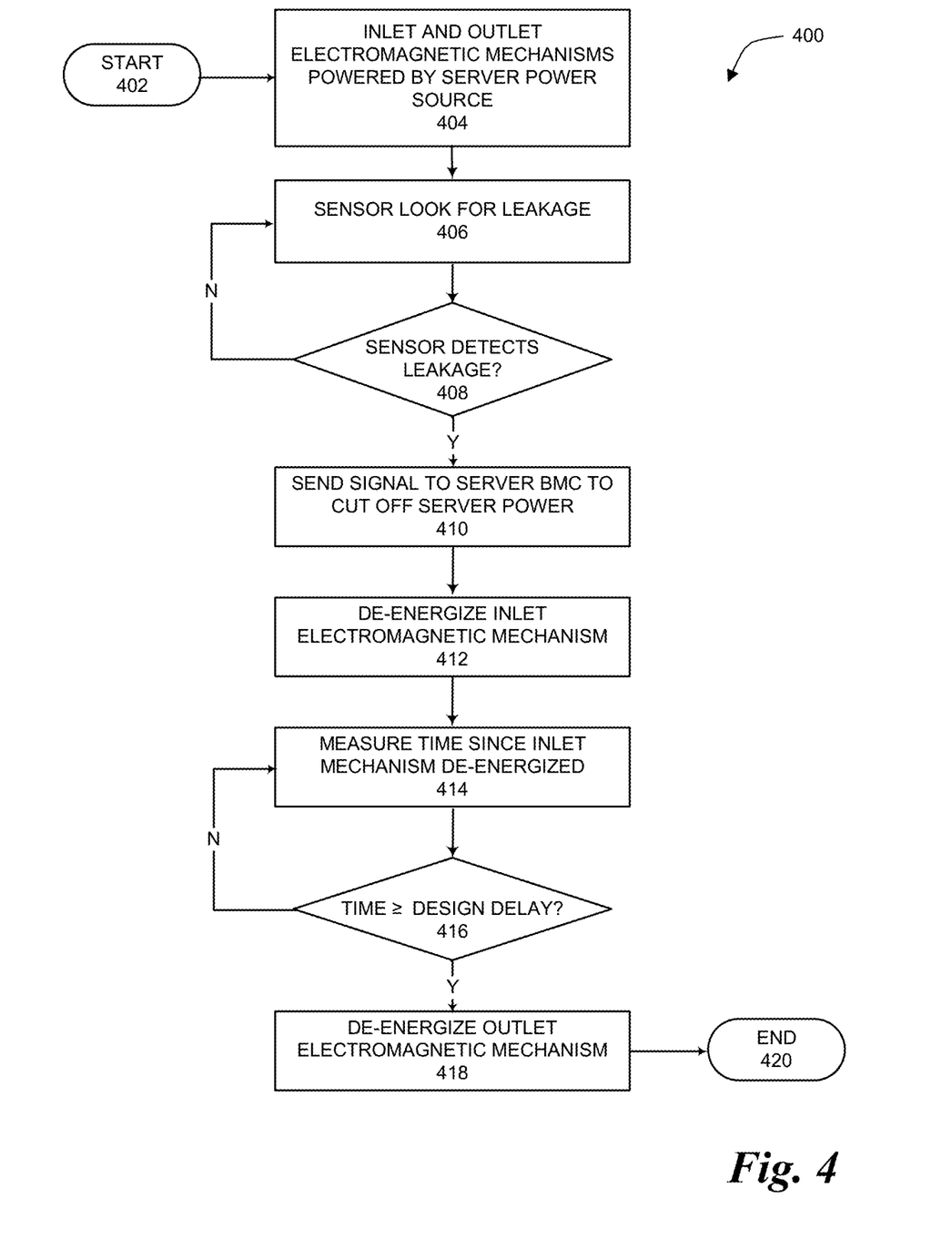
FIG. 4 is a flowchart of an embodiment of process for operating the cooling module of FIG. 2.

FIG. 4 illustrates, in flowchart form, an embodiment of the operation of cooling module 200. The process starts at block 402. At block 404 power is supplied to the electromagnetic mechanisms—in this embodiment, inlet mechanism 216 and outlet mechanism 222—by the server power source through connector 212. As described above for FIGS. 3A-3B, the supplied power causes the electromagnetic mechanisms to engage their supply and return lines. Cooling module 200 then begins operation, receiving fluid through the inlet, circulating it through the module, and returning it through the outlet. At block 406, leak detection sensors S look for fluid leakage in the module, and at block 408 the process determines whether any of sensors S have detected fluid leakage.

If at block 408 the sensors do not detect fluid leakage, the process returns to block 406, where it continues to look for leakage. But if at block 408 the sensors detect leakage, the process moves to block 410, where sensors S signal the server's BMC 228 to cut off power to the server. The process then moves to block 412, where the inlet electromagnetic mechanism is deenergized (i.e., power to it is cut off), thus disengaging inlet 208 from its supply line 218 (see FIGS. 3A-3B). In module 200, power to the inlet electromagnetic mechanism 116 is cut off immediately when the server power is cut off because the mechanisms get their power from the server through connector 212. Outlet electromagnetic mechanism 222 has power source 224 so that, when power from the server is cut off, power to the outlet electromagnetic mechanism is not cut off immediately, but rather continues for a time using power supplied by power source 224.

Having de-energized inlet electromagnetic mechanism 216 at block 412, the process moves to block 416, where it begins to measure the time since inlet electromagnetic mechanism 216 was de-energized. At block 416, the process checks whether the time since de-energizing the inlet electromagnetic mechanism equals or exceeds a designed time delay. If at block 416 the time since de-energizing the inlet electromagnetic mechanism is less than the design time delay, then the process returns to block 414, where it keeps measuring the time. But if at block 416 the time since de-energizing the inlet electromagnetic mechanism equals or exceed the design time delay, then the process moves to block 418, where outlet electromagnetic mechanism 222—after implementing the designed delay—is de-energized by cutting off the power supplied to it by separate power source 224. The process ends at block 420.

Figure 5:
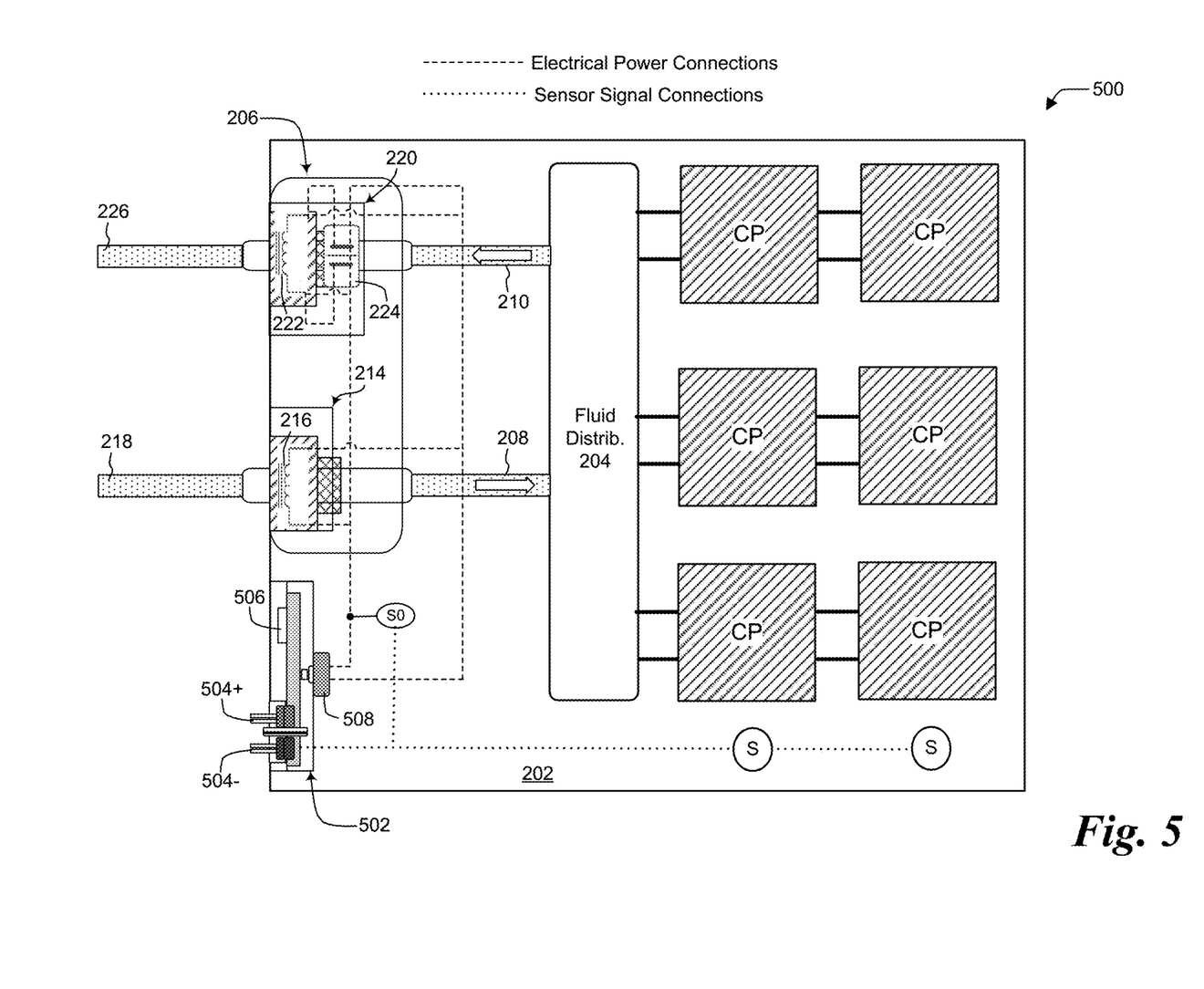
FIG. 5 is a plan view of another embodiment of cooling module for use with IT equipment.

FIG. 5 illustrates an embodiment of a liquid cooling module 500. Module 500 is in most respects similar to module 200. Module 500 includes a substrate 202 on which are positioned the same or similar components as module 200: cold plates CP, fluid distributor 204, fluid connections 208 and 210, fluid control module 206, leak detection sensors S, etc. The primary difference between modules 500 and 200 is the module's power source: module 200 gets electrical power from the server to which it is coupled by connector 212, but module 500 gets electrical power through its own power module 502.

Power module 502 includes a pair of clips 504 that electrically couple power module 502 to a busbar (not shown) in a rack in which the server and cooling module 500 are positioned. The server to which module 500 is coupled also gets its electrical power from the busbar. Clips 504 include a positive clip 504+ and a negative clip 504−. In addition to being electrically coupled to the busbar, clips 504 are coupled, via power electronics 506, to a connector 508. Power electronics 506 can include, for instance, rectifiers and voltage regulators. Connector 508 is electrically coupled to electromagnetic mechanisms 216 and 222 in the same way as the same mechanisms are coupled to connector 212 in module 200. A switch S0 is coupled in the line that delivers electrical power to mechanisms 216 and 222.

In module 500, leak detection sensors S are coupled to a controller (not shown), so that when the sensors detect a leak they notify the power module to shut down the power to the cooling module. In one embodiment the controller can be positioned within power module 502, but in other embodiments it can be positioned elsewhere. Sensors S may be internally connected to the control module on the power module to controlling the power as well as controlling power switch S0, which controls the power to electromagnetic mechanism 216.

In operation, module 500 works similarly to module 200, as shown for one embodiment in FIG. 4. The primary difference is that, because module 500 has its own power source and does not draw its power from the server to which it is coupled, it is not automatically shut down if the server is shut down—i.e., it can operate independently of the server. The module can cut off the fluid itself without relying on cutting off server power during a leakage incident, while the electronics may continuously operate thermally managed by redundant design.

Figure 6:
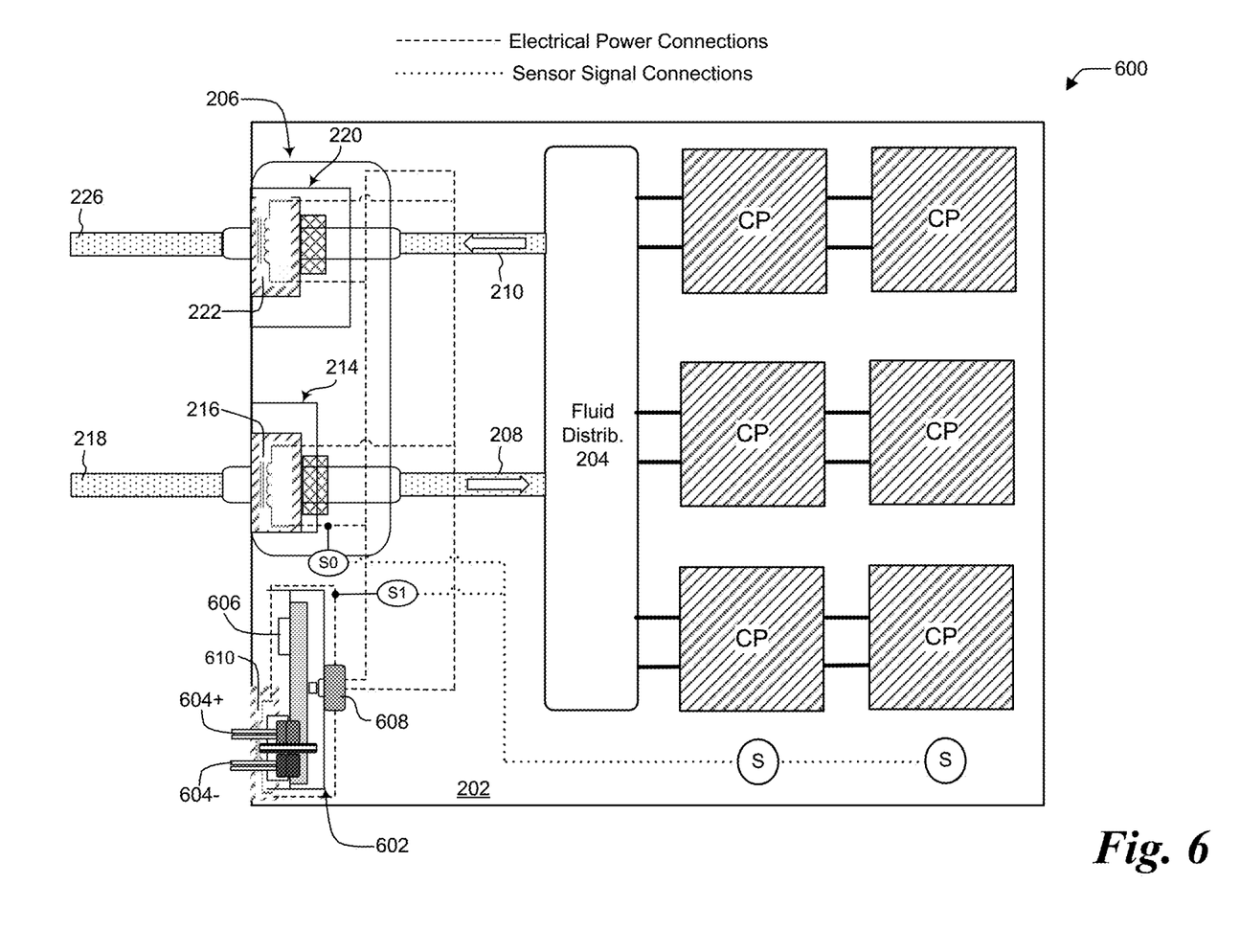
FIG. 6 is a plan view of another embodiment of cooling module for use with IT equipment.

FIG. 6 illustrates an embodiment of a cooling module 600. Module 600 is in most respects similar to module 500: it includes a substrate 202 on which are positioned the same or similar components as module 200: cold plates CP, fluid distributor 204, fluid connections 208 and 210, fluid control module 206, leak detection sensors S, etc. Module 600 also includes a power module 602. The primary differences between modules 600 and 500 are in the power module 602, outlet control 220, and the electrical connections between the power module, inlet control 214, and outlet control 220.

Power module 602 is in most respects similar to power module 502: it includes a pair of clips 604 (a positive clip 604+ and a negative clip 604−) that electrically couple power module 602 to a busbar (not shown) in a rack in which the server and cooling module 600 are positioned. In addition to being coupled to the busbar, clips 604 are coupled, via power electronics 606, to a connector 608. Power electronics 606 can include, for instance, rectifiers and voltage regulators. Connector 608 is then electrically coupled to electromagnetic mechanisms 216 and 222 similarly to how the same mechanisms are coupled to connector 212 in module 200. The main difference between power module 602 and power module 502 is that power module 602 includes its own electromagnetic mechanism 610 coupled to clips 604. Electromagnetic mechanism 610 operates similarly to electromagnetic mechanisms 216 and 222: it is coupled to clips 604 and can engage and disengage the clips from the busbar. In one embodiment, clips 605 and mechanism 610 can function analogously to the arrangement shown in FIGS. 3A-3B, where a spring or other elastic member applies a biasing force that biases clips 604 toward a position disconnected from the busbar. When mechanism 610 is energized, it applies a force to the clips that counters the elastic member's biasing force, thus forcing the clips to engage with the busbar. Conversely, when electromagnetic mechanism 610 is de-energized, the biasing force applied by the elastic member is no longer overcome by the electromagnetic force and the elastic member disengages the clips from the busbar.

In module 600, outlet control 220 omits power source 224, leading to different electrical and sensing connections. Leak detection sensors S are coupled to switches S0 and S1, so that when the sensors detect a leak they can command the switches to cut power to parts of fluid control module 206. Switch S0 is positioned in the line that delivers power to electromagnetic mechanism 216 and switch S1 is positioned further upstream from switch S0 in the line that delivers power to both electromagnetic mechanisms 216 and 222. Module 600 can operate similarly to modules 200 and 500, without the need for power source 224, by opening (i.e., turning off) switches S0 and S1 in the correct order—S0 first, then S1—so that the inlet is deactivated first, followed after a delay by deactivation of the outlet. This asynchronous operation of the switches S0 and S1 enable the remaining fluid to be pumped out of the cooling module. An embodiment of the operation of module 600 is illustrated below in FIG. 7.

Figure 7:
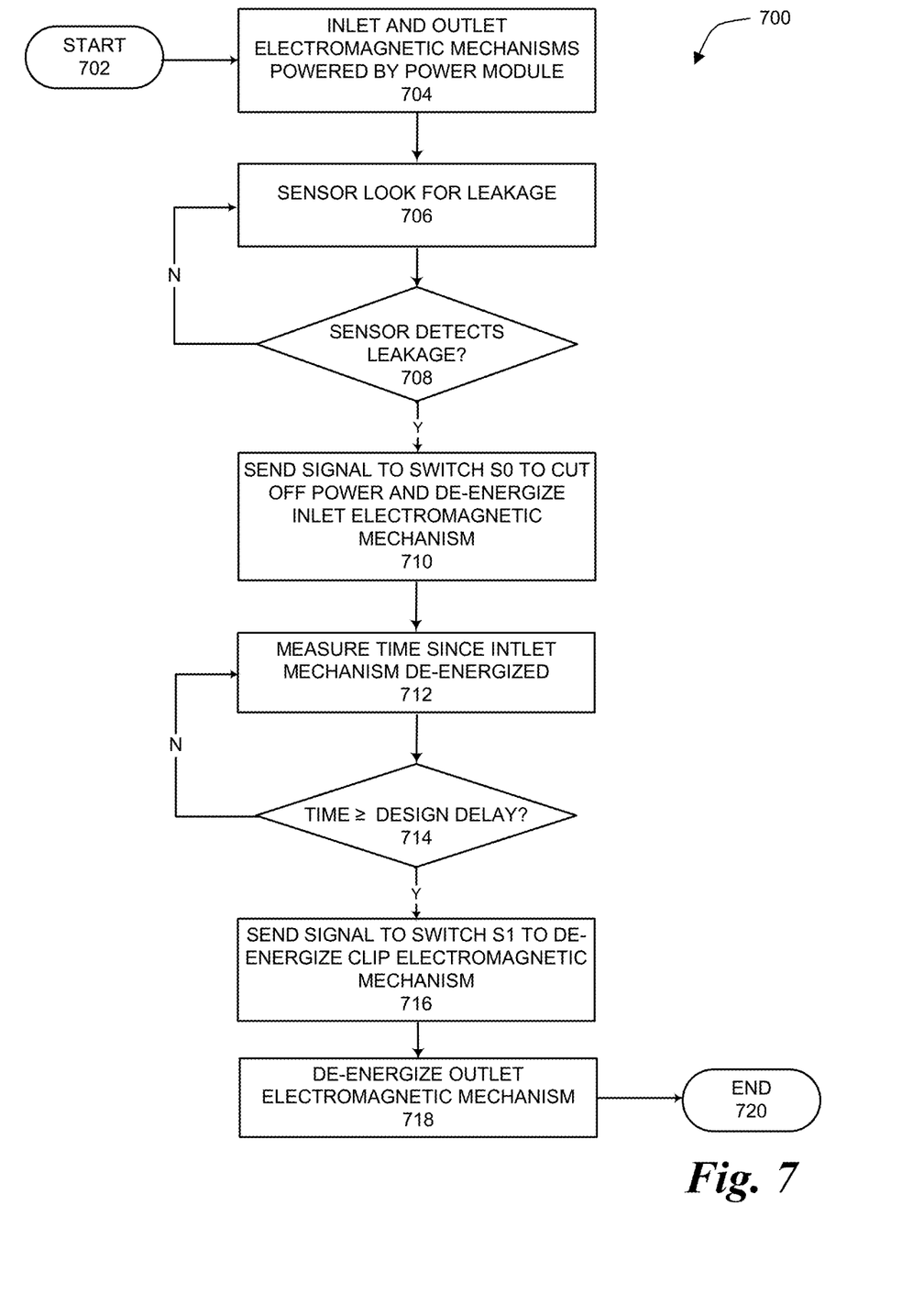
FIG. 7 is a flowchart of an embodiment of process for operating the cooling module of FIG. 6.

FIG. 7 illustrates, in flowchart form, an embodiment of the operation of a cooling module such as module 600. The process starts at block 702. At block 704 power is supplied by power module 602 to the electromagnetic mechanisms: mechanism 216 for the inlet, mechanism 222 for the outlet, and mechanism 610 for the power module. As described above for FIGS. 3A-3B, the supplied power causes the electromagnetic mechanisms to engage their supply and return lines. Cooling module 600 then starts operating, receiving fluid through the inlet, circulating it through the module, and returning it through the outlet. At block 706, leak detection sensors S look for fluid leakage in the module, and at block 708 the process determines whether any of sensors S detect fluid leakage.

If at block 708 the sensors detect no fluid leakage, the process returns to block 706, where it continues to look for leakage. But if at block 708 the sensors detect leakage, then the process moves to block 710, where sensors S signal switch S0 to open, cutting off power to inlet electromagnetic mechanism 216 and de-activating the mechanism and disengaging the inlet from its supply line (see FIGS. 3A-3B). Having de-energized inlet electromagnetic mechanism 216 at block 710, the process moves to block 712, where it begins to measure the time since inlet electromagnetic mechanism 216 was de-energized. At block 714, the process checks whether the time since de-energizing the inlet electromagnetic mechanism equals or exceeds a designed time delay. If at block 714 the time since de-energizing the inlet electromagnetic mechanism is less than the design time delay, then the process returns to block 712 where it keeps measuring the time. But if at block 714 the time since de-energizing the inlet electromagnetic mechanism equals or exceed the design time delay, then the process moves to block 716, where sensors S signal switch S1 to open, thus de-energizing (i.e., cutting off power to) outlet electromagnetic mechanism 610. De-energizing mechanism 610 disconnects clips 604 from the rack busbar, cutting off power to module 600. With power cut off to the entire module, power is also cut off to electromagnetic mechanism 220, so that at block 718 return line 226 disengages from outlet connection 210, thus stopping flow out of module 600, and at block 718 the entire cooling module power is physically cut off from the source. The process ends at block 720.

Figure 8:
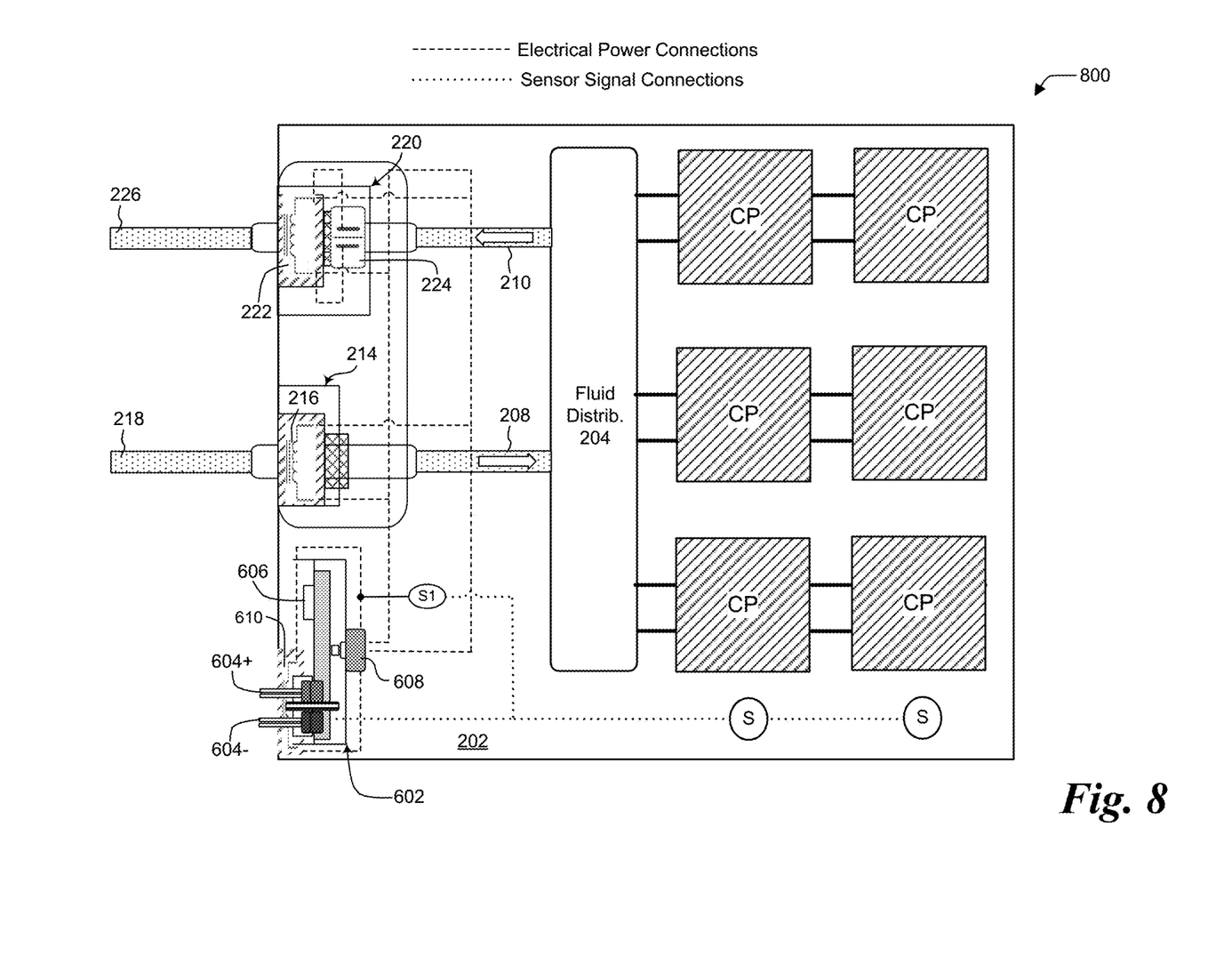
FIG. 8 is a plan view of another embodiment of cooling module for use with IT equipment.

FIG. 8 illustrates an embodiment of a rack cooling module 800. Module 800 is in most respects similar to module 600: it includes a substrate 202 on which are positioned the same or similar components as module 600: cold plates CP, fluid distributor 204, fluid connections 208 and 210, fluid control module 206, leak detection sensors S, etc. Module 800 also includes a power module 602. The primary differences between modules 800 and 600 are in outlet control 220 and the electrical connections between the power module, inlet control 214, and outlet control 220.

In module 600, outlet control 220 includes energy source 224, which leads to different electrical and sensing connections. Leak detection sensors S are coupled to switch S1, which is positioned in the line that delivers electrical power to electromagnetic mechanism 610. Module 600 operates similarly to modules 200: when sensors S detect a leak they signal switch S1 to open, cutting off power to electromagnetic mechanism 610. With power to mechanism 610 cut off, clips 604 are retracted from the busbar, physically cutting off power to power module 602 and thus cutting off power to all of module 800. With all power cut off, electromagnetic mechanism 216 disengages supply line 218 from the inlet, as shown in FIGS. 3A-3B. Energy source 224 continues to deliver power to electromagnetic mechanism 222 for a specified delay period. When the delay period is over, power is cut to mechanism 222 and the outlet is disengaged from return line 228, terminating fluid flow through the module.

Other fluid distribution embodiments are possible besides the ones described above. For instance:
Different actual leak detection system and hardware can be implemented.
The solution can be used for different cooling module design.
The design can be slightly modified to be used with different servers.

The above description of embodiments is not intended to be exhaustive or to limit the invention to the described forms. Specific embodiments of, and examples for, the invention are described herein for illustrative purposes, but various modifications are possible.

What is claimed is:

1. A cooling apparatus comprising:
one or more cold plates mounted on a substrate, each cold plate adapted to be thermally coupled to a heat-generating electronic component on a piece of IT equipment;
a fluid control module mounted to the substrate and fluidly coupled to the one or more cold plates, the fluid control module including:
a fluid inlet including an inlet mechanism adapted to enable and disable the fluid inlet, wherein the inlet mechanism enables the fluid inlet when energized and disables the fluid inlet when de-energized, and
a fluid outlet including an outlet mechanism adapted to enable and disable the fluid outlet, wherein the outlet mechanism enables the fluid outlet when energized and disables the fluid outlet when de-energized,
wherein when the inlet mechanism is de-energized, the outlet mechanism is deenergized after a delay; and
a power supply electrically coupled to the inlet mechanism and the outlet mechanism.

2. The apparatus of claim 1 wherein the power supply is an IT power supply of the piece of IT equipment to which the one or more cold plates are thermally coupled.

3. The apparatus of claim 2, further comprising one or more leak-detection sensors positioned on the substrate and communicatively coupled to a baseboard management controller (BMC) on the piece of IT equipment, the BMC also being coupled to the IT power supply.

4. The apparatus of claim 3, further comprising an auxiliary power supply coupled to the outlet mechanism to implement the delay.

5. The apparatus of claim 1 wherein the power supply is a power module mounted to the substrate and adapted to be coupled to a rack power source by a pair of clips.

6. The apparatus of claim 5, further comprising:
one or more leak detection sensors mounted on the substrate;
a switch coupled to the one or more leak detection sensors and coupled in an electrical connection between the power module, the inlet mechanism, and the outlet mechanism; and
an auxiliary power supply coupled to the outlet mechanism to implement the delay.

7. The apparatus of claim 5 wherein the power module includes a disconnect mechanism adapted to connect and disconnect the clips to the rack power source, wherein the disconnect mechanism physically connects the clips to the rack power source when energized and physically disconnects the clips from the rack power source when de-energized.

8. The apparatus of claim 7, further comprising:
one or more leak detection sensors mounted on the substrate;
a first switch coupled to the one or more leak detection sensors and coupled in an electrical connection between the power module and the inlet mechanism;
a second switch coupled to the one or more leak detection sensors and coupled in an electrical connection between the power module and the disconnect mechanism;
wherein the delay is implemented by opening the first switch, then opening the second switch at the end of the delay period.

9. The apparatus of claim 7, further comprising:
one or more leak detection sensors mounted on the substrate;

a switch coupled to the one or more leak detection sensors and coupled in an electrical connection between the power module and the disconnect mechanism; and an auxiliary power supply coupled to the outlet mechanism to implement the delay.

10. The apparatus of claim 1 wherein disabling the fluid inlet comprises disconnecting the fluid inlet from a fluid supply and disabling the fluid outlet comprises disconnecting the fluid outlet from a fluid return.

11. A cooling system comprising:
a piece of information technology (IT) equipment;
a cooling module coupled to the piece of IT equipment, the cooling module comprising:
one or more cold plates mounted on a substrate, each cold plate adapted to be thermally coupled to a heat-generating electronic component on a piece of IT equipment;
a fluid control module mounted to the substrate and fluidly coupled to the one or more cold plates, the fluid control module including:
a fluid inlet including an inlet mechanism adapted to enable and disable the fluid inlet, wherein the inlet mechanism enables the fluid inlet when energized and disables the fluid inlet when de-energized, and
a fluid outlet including an outlet mechanism adapted to enable and disable the fluid outlet, wherein the outlet mechanism enables the fluid outlet when energized and disables the fluid outlet when de-energized,
wherein when the inlet mechanism is de-energized, the outlet mechanism is deenergized after a delay; and
a power supply electrically coupled to the inlet mechanism and the outlet mechanism.

12. The cooling system of claim 11 wherein the power supply is an IT power supply of the piece of IT equipment to which the one or more cold plates are thermally coupled.

13. The cooling system of claim 12, further comprising one or more leak-detection sensors positioned on the substrate and communicatively coupled to a board management controller (BMC) on the piece of IT equipment, the BMC also being coupled to the IT power supply.

14. The cooling system of claim 13, further comprising an auxiliary power supply coupled to the outlet mechanism to implement the delay.

15. The cooling system of claim 11 wherein the power supply is a power module mounted to the substrate and adapted to be coupled to a rack power source by a pair of clips.

16. The cooling system of claim 15, further comprising:
one or more leak detection sensors mounted on the substrate;
a switch coupled to the one or more leak detection sensors and coupled in an electrical connection between the power module, the inlet mechanism, and the outlet mechanism; and
an auxiliary power supply coupled to the outlet mechanism to implement the delay.

17. The cooling system of claim 15 wherein the power module includes a disconnect mechanism adapted to connect and disconnect the clips to the rack power source, wherein the disconnect mechanism physically connects the clips to the rack power source when energized and physically disconnects the clips from the rack power source when de-energized.

18. The cooling system of claim 17, further comprising:
one or more leak detection sensors mounted on the substrate;
a first switch coupled to the one or more leak detection sensors and coupled in an electrical connection between the power module and the inlet mechanism;
a second switch coupled to the one or more leak detection sensors and coupled in an electrical connection between the power module and the disconnect mechanism;
wherein the delay is implemented by opening the first switch, then opening the second switch at the end of the delay period.

19. The cooling system of claim 17, further comprising:
one or more leak detection sensors mounted on the substrate;
a switch coupled to the one or more leak detection sensors and coupled in an electrical connection between the power module and the disconnect mechanism; and
an auxiliary power supply coupled to the outlet mechanism to implement the delay.

20. The cooling system of claim 11 wherein disabling the fluid inlet comprises disconnecting the fluid inlet from a fluid supply and disabling the fluid outlet comprises disconnecting the fluid outlet from a fluid return.

* * * * *